United States Patent
Hiner et al.

(10) Patent No.: US 8,026,587 B1
(45) Date of Patent: Sep. 27, 2011

(54) SEMICONDUCTOR PACKAGE INCLUDING TOP-SURFACE TERMINALS FOR MOUNTING ANOTHER SEMICONDUCTOR PACKAGE

(75) Inventors: David Jon Hiner, Chandler, AZ (US); Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/802,661

(22) Filed: Jun. 10, 2010

Related U.S. Application Data

(60) Continuation of application No. 12/655,724, filed on Jan. 5, 2010, which is a division of application No. 11/595,411, filed on Nov. 9, 2006, now Pat. No. 7,671,457, which is a division of application No. 10/806,640, filed on Mar. 23, 2004, now Pat. No. 7,185,426, which is a continuation-in-part of application No. 10/138,225, filed on May 1, 2002, now Pat. No. 6,930,256.

(51) Int. Cl.
*H01L 23/22* (2006.01)
(52) U.S. Cl. ........ 257/687; 257/693; 257/698; 257/773; 257/774; 257/E23.011
(58) Field of Classification Search .................. 257/698, 257/686, 777, E25.006, E25.013, E25.018, 257/E25.021, E25.027, E23.085, 693, 773, 257/774, 87, E23.011, E23.067, E23.068, 257/E23.069
See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |

(Continued)

FOREIGN PATENT DOCUMENTS

JP 05-109975 4/1993

(Continued)

OTHER PUBLICATIONS

Scanlan et al., "Semiconductor Package Including a Top-Surface Metal Layer for Implementing Circuit Features", U.S. Appl. No. 12/802,715, filed Jun. 10, 2010.

(Continued)

*Primary Examiner* — Jasmine Clark
(74) *Attorney, Agent, or Firm* — Gunnison, McKay & Hodgson, L.L.P.; Serge J. Hodgson

(57) ABSTRACT

A semiconductor package including top-surface terminals for mounting another semiconductor package provides a three-dimensional circuit configuration that can provide removable connection of existing grid-array packages having a standard design. A semiconductor die is mounted on an electrically connected to a circuit substrate having terminals disposed on a bottom side for connection to an external system. The die and substrate are encapsulated and vias are laser-ablated or otherwise formed through the encapsulation to terminals on the top surface of the substrate that provide a grid array mounting lands to which another grid array semiconductor package may be mounted. The bottom side of the vias may terminate and electrically connect to terminals on the substrate, terminals on the bottom of the semiconductor package (through terminals) or terminals on the top of the semiconductor die. The vias may be plated, paste-filled, filled with a low melting point alloy and may have a conical profile for improved plating performance.

17 Claims, 2 Drawing Sheets

U.S. PATENT DOCUMENTS

| | | | |
|---|---|---|---|
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,898,219 A | 4/1999 | Barrow |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,489,676 B2 | 12/2002 | Taniguchi et al. |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 * | 5/2004 | Sasaki .................... 257/687 |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,946,325 B2 | 9/2005 | Yean et al. |
| 6,953,995 B2 | 10/2005 | Farnworth et al. |
| 6,963,141 B2 | 11/2005 | Lee et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,087,514 B2 | 8/2006 | Shizuno |
| 7,125,744 B2 | 10/2006 | Takehara et al. |
| 7,185,426 B1 | 3/2007 | Hiner et al. |
| 7,189,593 B2 | 3/2007 | Lee |
| 7,198,980 B2 | 4/2007 | Jiang et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,420,809 B2 | 9/2008 | Lim et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |

| | | | |
|---|---|---|---|
| 2003/0025199 | A1 | 2/2003 | Wu et al. |
| 2003/0128096 | A1 | 7/2003 | Mazzochette |
| 2003/0134450 | A1 | 7/2003 | Lee |
| 2003/0141582 | A1 | 7/2003 | Yang et al. |
| 2003/0197284 | A1 | 10/2003 | Khiang et al. |
| 2004/0063246 | A1 | 4/2004 | Karnezos |
| 2004/0145044 | A1 | 7/2004 | Sugaya et al. |
| 2004/0159462 | A1 | 8/2004 | Chung |
| 2005/0046002 | A1 | 3/2005 | Lee et al. |
| 2005/0139985 | A1 | 6/2005 | Takahashi |
| 2005/0242425 | A1 | 11/2005 | Leal et al. |
| 2006/0008944 | A1 | 1/2006 | Shizuno |
| 2006/0270108 | A1 | 11/2006 | Farnworth et al. |
| 2007/0273049 | A1 | 11/2007 | Khan et al. |
| 2007/0281471 | A1 | 12/2007 | Hurwitz et al. |
| 2007/0290376 | A1 | 12/2007 | Zhao et al. |
| 2008/0230887 | A1 | 9/2008 | Sun et al. |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

IBM Technical Disclosure Bulletin, "Microstructure Solder Mask by Means of a Laser", vol. 36, Issue 11, p. 589, Nov. 1, 1993. (NN9311589).

Kim et al., "Application of Through Mold Via (TMV) as PoP base package", $58^{th}$ ECTC Proceedings, May 2008, Lake Buena Vista, FL, 6 pages, IEEE.

SCANLAN, "Package-on-package (PoP) with Through-mold Vias", Advanced Packaging, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

Berry et al., "Thin Stacked Interposer Package", U.S. Appl. No. 11/865,617, filed Oct. 1, 2007.

Longo et al., "Stacked Redistribution Layer (RDL) Die Assembly Package", U.S. Appl. No. 12/387,672, filed May 5, 2009.

Huemoeller et al., "Buildup Dielectric Layer Having Metallization Pattern Semiconductor Package Fabrication Method", U.S. Appl. No. 12/387,691, filed May 5, 2009.

Miller Jr. et al., "Thermal Via Heat Spreader Package and Method", U.S. Appl. No. 12/421,118, filed Apr. 9, 2009.

Scanlan et al., "Semiconductor Package Including a Top-Surface Metal Layer for Implementing Circuit Features", U.S. Appl. No. 12/589,839, filed Oct. 28, 2009.

Hiner et al., "Semiconductor Package Including Top-Surface Terminals for Mounting Another Semiconductor Package", U.S. Appl. No. 12/655,724, filed Jan. 5, 2010.

SCANLAN, "Stacked Redistribution Layer (RDL) Die Assembly Package", U.S. Appl. No. 12/294,493, filed Sep. 27, 2010.

\* cited by examiner (12)

SEMICONDUCTOR PACKAGE INCLUDING TOP-SURFACE TERMINALS FOR MOUNTING ANOTHER SEMICONDUCTOR PACKAGE

CROSS-REFERENCE TO RELATED APPLICATIONS

The present application is a continuation of U.S. Patent Application "SEMICONDUCTOR PACKAGE INCLUDING TOP-SURFACE TERMINALS FOR MOUNTING ANOTHER SEMICONDUCTOR PACKAGE", Ser. No. 12/655,724, filed on Jan. 5, 2010, which is a divisional of U.S. Patent Application "SEMICONDUCTOR PACKAGE INCLUDING TOP-SURFACE TERMINALS FOR MOUNTING ANOTHER SEMICONDUCTOR PACKAGE", Ser. No. 11/595,411, filed on Nov. 9, 2006, now U.S. Pat. No. 7,671,457, issued Mar. 2, 2010, which is a divisional of U.S. Patent Application "METHOD OF MANUFACTURING A SEMICONDUCTOR PACKAGE", Ser. No. 10/806,640, filed on Mar. 23, 2004, now U.S. Pat. No. 7,185,426, issued Mar. 6, 2007, which is a continuation-in-part of U.S. Patent Application "INTEGRATED CIRCUIT SUBSTRATE HAVING LASER-EMBEDDED CONDUCTIVE PATTERNS AND METHOD THEREFOR", Ser. No. 10/138,225 filed on May 1, 2002, now U.S. Pat. No. 6,930,256, issued Aug. 16, 2005. The specifications of the above-referenced Patent Applications are herein incorporated by reference.

FIELD OF THE INVENTION

The present invention relates generally to semiconductor packaging, and more specifically, to a semiconductor package having top-surface grid array terminals for mounting another semiconductor package.

BACKGROUND OF THE INVENTION

Semiconductor packages that provide mechanical mounting and electrical interconnection of a semiconductor die are commonly provided in ball grid array and land grid array configurations. A semiconductor die is electrically connected to a substrate with a grid array terminals disposed on the "bottom" side of the semiconductor package and solder balls are attached for connection to a system substrate, typically a printed circuit board (PCB) having lands located to attach the solder balls of the semiconductor package (referred to as ball grid array or BGA attach). Alternatively, conductive paste, a socket or "interposer" may be used to provide contacts between lands of the semiconductor package and lands on the system substrate (referred to as land grid array or LGA connection).

Typical system interconnect of grid array type packaging is generally two-dimensional. That is, multiple grid array devices are mounted on a PCB in different locations along the surface of the PCB and interconnected via circuit traces on or within the PCB. Such mounting is suitable for small, thin assemblies, but when the area of a PCB is of concern in a design, or in systems where other components are much taller than the semiconductor packages are present, it would be desirable to require less circuit board area by stacking semiconductor packages.

Specific semiconductor packages used for implementing three-dimensional stacked packages are well known in the art. However, such packaging is typically not compatible with existing integrated circuit packages, so that two or more integrated circuits that are "stacked" must all be designed for stacking.

Also, when combining multiple semiconductor packages in an assembly, at times it is advantageous to permit removal of at least of one semiconductor package, so that when one semiconductor package is used with one of multiple alternative other semiconductor packages in a three-dimensional configuration, the interconnect between a semiconductor package may be standardized and so that one of the semiconductor packages may be removed and replaced without removing the other.

Therefore, it would be desirable to provide a semiconductor package that facilitates stacking of grid arrays and a method of manufacturing such a semiconductor package. It would further be desirable to provide such a package that provides mounting of another grid array or other semiconductor package that is removable and that may be interchangeably standardized.

SUMMARY OF THE INVENTION

The above objectives are accomplished in a semiconductor package having terminals on the semiconductor package top surface for mounting and electrically connecting to terminals of a piggybacked semiconductor package and method for manufacturing the semiconductor package. The semiconductor package includes a semiconductor die mounted on a substrate and an encapsulation covering the semiconductor die and at least the top surface of the substrate. Multiple terminals are provided on a top surface of the encapsulation for attachment of the piggybacked semiconductor package, which may be a standard ball grid or land grid array package.

The top-surface terminals may be top surfaces of vias formed through the encapsulation by laser-ablation or other mechanism and filled with conductive paste or a low melting-temperature alloy or plated. The vias may have a conical profile to improved plating uniformity. The vias may terminate on the substrate circuit pattern, on electrical terminals on the top surface of the semiconductor die, or may pass through the encapsulation and the substrate to provide lands for bottom-side terminals.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

The present invention concerns a semiconductor package and a method for manufacturing a semiconductor package that provide for top mounting of another semiconductor package in a "piggyback" configuration. While the exemplary embodiments depict ball grid array packages mounted atop a plurality of lands on the top side of a modified semiconductor package, it should be understood by those skilled in the art, that the techniques of the present invention can be extended to other types of semiconductor interconnects.

Figure 1A:
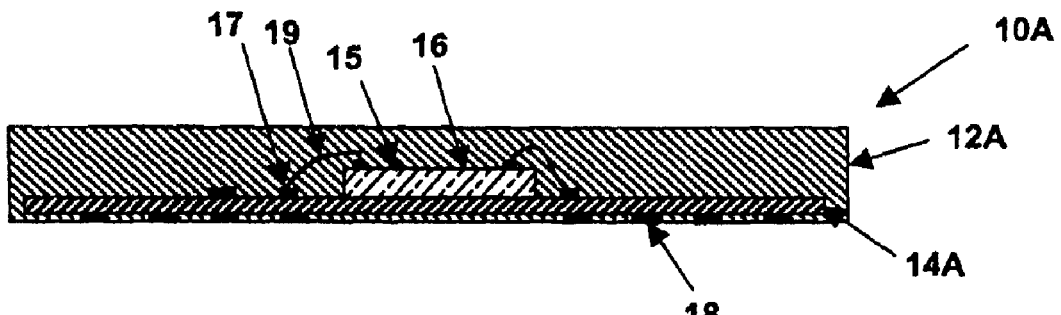
FIG. 1A is a pictorial diagram depicting a cross sectional side view of a semiconductor package for forming a modified semiconductor package in accordance with an embodiment of the invention.

Referring now to FIG. 1A, a semiconductor package 10A for forming a semiconductor package and corresponding to a first illustrated step of manufacture is depicted. Semiconductor package 10A is in the form of a ball grid array (BGA) or land grid array (LGA) package as is commonly known in the art, except that particular circuit features are positioned for providing vias to the top side of semiconductor package 10A in subsequent manufacturing steps, so that another semiconductor package may be mounted atop semiconductor package 10A.

Semiconductor package 10A includes a die 16 mounted to a substrate 14A that includes lands 18 to which solder ball terminals may be attached or that may be connected with a conductive paste to form a LGA mounted semiconductor package. Encapsulation 12A surrounds die and substrate 14A, although substrate 14A may alternatively be exposed on a bottom side of semiconductor package 10A. Electrical connections 15 of die 16 are connected to circuit patterns 17 on substrate 14A via wires 19, but the type of die mounting is not limiting, but exemplary and other die mounting types may be used such as flip-chip die mounting. Additionally, while substrate 14A is depicted as a film or laminate-type mounting structure, lead frame and other substrate technologies may be used within the structures of the present invention.

Figure 1B:
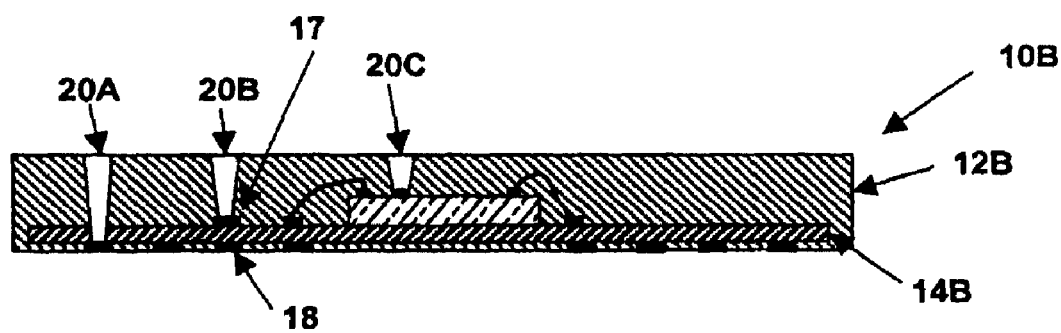
FIG. 1B is a pictorial diagram depicting a cross sectional side view of the semiconductor package of FIG. 1A after via holes have been formed.

Referring now to FIG. 1B, a first modification to semiconductor package 10A that illustrates a second step in the manufacturing process to form semiconductor package 10B is shown. Semiconductor package 10B includes a plurality of via holes 20A, 20B and 20C laser-ablated through encapsulation 12A of FIG. 1A to form encapsulation 12B. While only three via holes are shown, many vias holes will be provided, generally in the form of a grid array for mounting a second BGA/LGA package atop the semiconductor package. The three via holes shown illustrate the three different types of via holes that may be provided through control of laser energy and exposure time. The first via hole type, illustrated as via 20A, is fabricated by laser-ablating either completely through semiconductor package 10B or by laser-ablating through encapsulation 12A to the top side of lands 18, so that a connection is provided through from the top side of semiconductor package 10B to the bottom side of semiconductor package 10B when the via is filled. If via 20A is ablated completely through, then the corresponding land 18 is provided by the bottom surface of a via formed in hole 20A.

The next type of via hole is provided by laser-ablating through encapsulation 12A to reach circuit pattern 17 to that connection may be made through substrate 14A circuit patterns to die 16 electrical terminals, to lands 18 or both. The last type of via is provided by laser-ablating through encapsulation 12A to reach electrical connections 15 of die 16 so that direct connection to the circuits of die 16 can be made from a piggybacked semiconductor package. Each of via holes 22A, 22B and 22C is depicted as a via hole having a conical cross-section, which is desirable for providing uniform plating current density during a plating process. However, via holes 22A, 22B and 22C may alternatively be made cylindrical in shape if the advantage of cylindrical cross-section is not needed, for example if a conductive paste is used to fill the via holes.

Figure 1C:
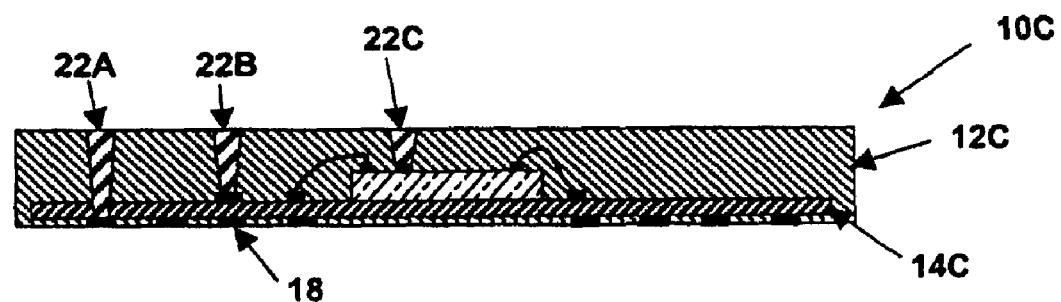
FIG. 1C is a pictorial diagram depicting a cross sectional side view of the semiconductor package of FIG. 1B after vias are filled.

Referring now to FIG. 1C, a semiconductor package 10C is illustrated forming a complete LGA package. Conductive material is applied within via holes 20A, 20B and 20C to form conductive vias 22A, 22B and 22C through encapsulation 12C and optionally substrate 14C for vias that are formed completely through substrate 14C. The conductive material used to form vias 22B and 22C may be electroplated or electro-less plated metal, conductive paste such as copper or silver epoxy compounds, or a low melting temperature high-wicking solder alloy such as SUPER SOLDER.

Figure 1D:
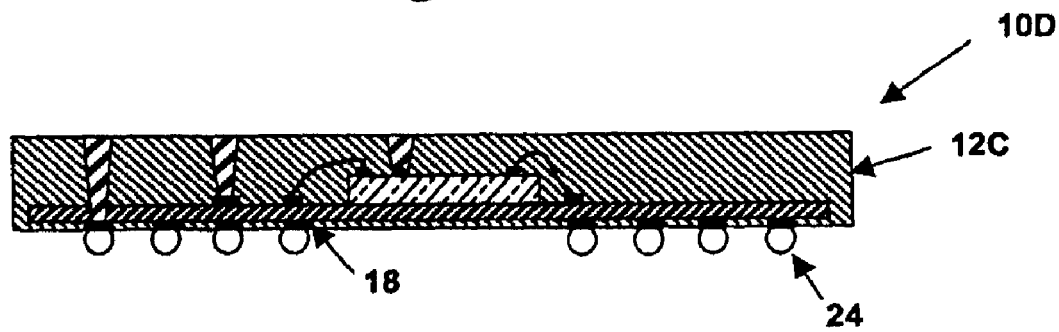
FIG. 1D is a pictorial diagram depicting a cross sectional side view of the semiconductor package of FIG. 1C after solder balls are attached to lands.

Referring now to FIG. 1D, a semiconductor package 10D is illustrated forming a complete BGA package. Solder balls 24 are attached to lands 18 to provide the BGA terminals used to connect semiconductor package 10D to a system substrate, such as a PCB.

Figure 2A:
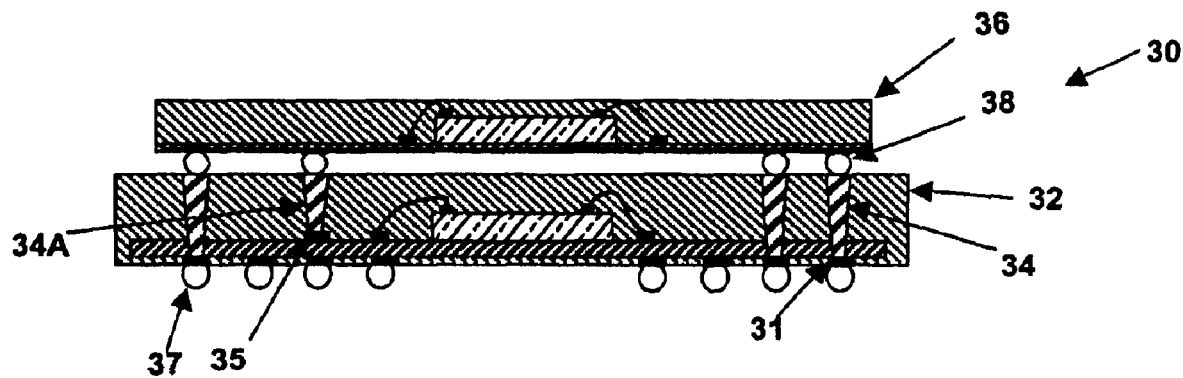
FIG. 2A is a pictorial diagram depicting an electronic assembly in accordance with an embodiment of the present invention.

Referring now to FIG. 2A, an electronic assembly 30 in accordance with an embodiment of the invention is depicted. Electronic assembly 30 includes a base semiconductor package 32 as formed by the above-described process that includes through-to-land vias 34 to lands 31 and through-to-substrate vias 34A provided that contact the conductive pattern 35 on the top side of the substrate. A piggybacked second semiconductor package 36, of BGA design, is attached via solder balls 38 that provide connection to the tops of vias 34 and 34A and connect the terminals of semiconductor package 36 to internal circuits of base semiconductor package 32 or to isolated terminals 37 provided on the bottom side of base semiconductor package 36. The piggyback mounting configuration provides advantages over custom-designed three dimensional packaging, as semiconductor package 36 may be a standardized part or a part having a design not under the control of a maker of base semiconductor package 32 and therefore the provision of a top side BGA/LGA pattern on base semiconductor package 32 makes it possible to stack a pre-designed standard BGA/LGA package. Also, even when control of the design of semiconductor package 36 is possible, use of a standardized layout such as BGA/LGA provides compatibility with standard PCB package attach layouts where semiconductor package 36 may also be used in a board mounted configuration without piggybacking.

Figure 2B:
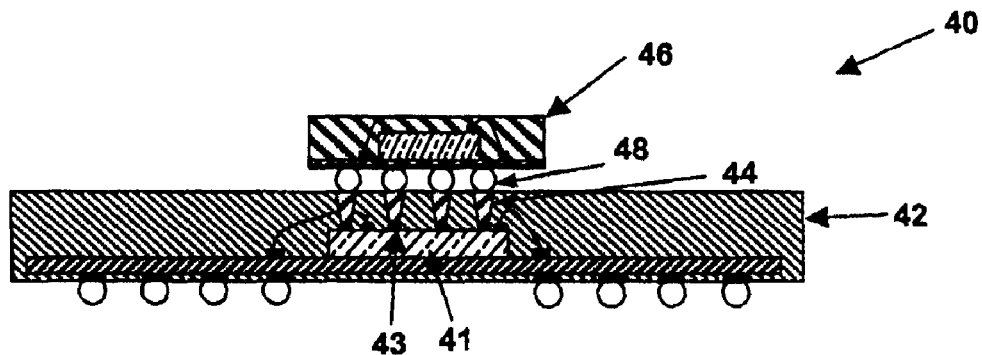
FIG. 2B is a pictorial diagram depicting an electronic assembly in accordance with another embodiment of the present invention.

Referring now to FIG. 2B, an electronic assembly 40 is shown in accordance with another embodiment of the invention. Vias 44 are provided through to electrical connections 43 of die 41, providing a direct interface from the circuits of die 41 to circuits within piggybacked semiconductor package 46. Attachment of semiconductor package 46 is made via solder balls 48 where semiconductor package 46 may be a standard BGA package or a custom package layout designed to interface with electrical connections 43 of die 41. The depicted configuration is especially useful where short physical connections from a first semiconductor package 42 must be provided to a second interchangeable semiconductor package 46.

Figure 2C:
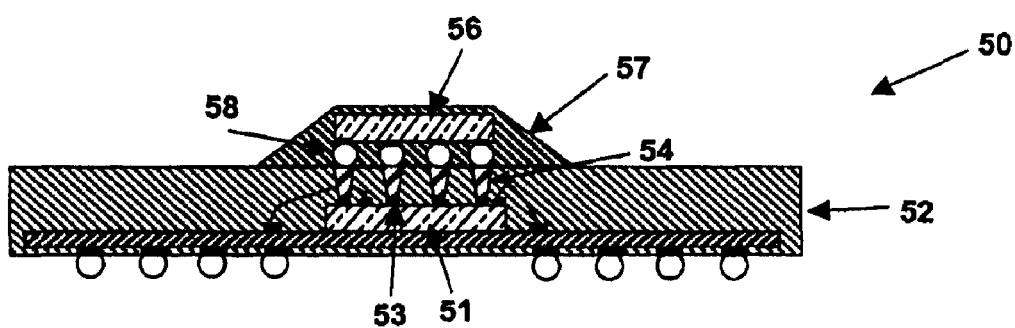
FIG. 2C is a pictorial diagram depicting an electronic assembly in accordance with yet another embodiment of the present invention.

Referring now to FIG. 2C, an electronic assembly 50 is shown in accordance with another embodiment of the invention. Vias 54 are provided through to electrical connections 53 of die 51, providing a direct interface from the circuits of die 51 to circuits within piggybacked semiconductor die 56, which is depicted as a flip-chip die. Attachment of semiconductor die 56 is made via solder balls 58 (or alternatively posts) where semiconductor die 56 is custom package layout designed to interface with electrical connections 53 of die 51. The depicted configuration is especially useful where die 56 is one of several interchangeable dies that may be used to upgrade or provide options for use with die 51. An optional encapsulation 57, is depicted as deposited over die 56.

In addition to the die electrical connection interface depicted in FIG. 2C, through-to-land or through-to-substrate circuit pattern vias may also be used to connect a die such as flip-chip die 56 directly to terminals of base semiconductor package 52 or circuit patterns on an internal substrate. Such configurations provide the advantages of three-dimensional stacking without requiring direct connection to a die within base semiconductor package 52.

The above description of embodiments of the invention is intended to be illustrative and not limiting. Other embodiments is of this invention will be obvious to those skilled in the art in view of the above disclosure and fall within the scope of the present invention.

What is claimed is:

1. A semiconductor package, comprising:
a semiconductor die;
a substrate comprising:
bottom-side terminals on a bottom side of the substrate;
a conductive circuit pattern for connecting electrical connections of the semiconductor die to the bottom-side terminals, wherein the semiconductor die is on a top side of the substrate;
an encapsulation covering at least part of the semiconductor die; and
vias extending through at least the encapsulation and contacting the bottom-side terminals, the vias forming top-surface terminals at a top surface of the encapsulation, wherein the vias extend through the substrate to contact the top side of the bottom-side terminals.

2. The semiconductor package of claim 1 wherein the vias are not exposed at the bottom side of the substrate.

3. The semiconductor package of claim 1, wherein the conductive pattern connects the vias to the electrical connections of the semiconductor die.

4. The semiconductor package of claim 1, wherein the vias have a conical cross section.

5. A semiconductor package, comprising:
a semiconductor die;
a substrate comprising:
bottom-side terminals on a bottom side of the substrate;
a conductive circuit pattern for connecting electrical connections of the semiconductor die to the bottom-side terminals, wherein the semiconductor die is on a top side of the substrate;
an encapsulation covering at least part of the semiconductor die; and
vias extending through at least the encapsulation and directly contacting the bottom-side terminals, the vias forming top-surface terminals at a top surface of the of the encapsulation, wherein the top-surface terminals form a land grid array.

6. A semiconductor package, comprising:
a semiconductor die;
a substrate comprising:
bottom-side terminals on a bottom side of the substrate:
a conductive circuit pattern for connecting electrical connections of the semiconductor die to the bottom-side terminals, wherein the semiconductor die is on a top side of the substrate;
an encapsulation covering the entire semiconductor die; and
vias extending through at least the encapsulation and directly contacting the bottom-side terminals, the vias forming top-surface terminals at a top surface of the encapsulation.

7. A semiconductor package, comprising:
a semiconductor die comprising electrical connections;
bottom-side terminals coupled to the electrical connections of the semiconductor die;
an encapsulation covering the entire semiconductor die; and
vias extending through at least the encapsulation and directly contacting the bottom-side terminals, the vias forming top-surface terminals at a top surface of the encapsulation.

8. The semiconductor package of claim 7 further comprising a substrate, the substrate comprising the bottom-side terminals at a bottom side of the substrate.

9. The semiconductor package of claim 8 wherein the substrate further comprises a circuit pattern on a top side of the substrate.

10. The semiconductor package of claim 7 further comprising laser-ablated via holes extending through at least the encapsulation.

11. The semiconductor package of claim 10 wherein the vias comprise conductive material within the via holes.

12. The semiconductor package of claim 7 wherein the vias extend to a top side of the bottom-side terminals.

13. The semiconductor package of claim 7 further comprising wires coupled to the electrical connections of the semiconductor die.

14. A semiconductor package, comprising:
a semiconductor die on a substrate, the semiconductor die being electrically connected to a circuit pattern of the substrate, wherein the substrate has a plurality of bottom-side terminals on a bottom side;
an encapsulation covering the entire semiconductor die;
laser-ablated via holes through at least the encapsulation; and
top-surface terminals formed by conductor-filled vias within the laser-ablated via holes, wherein the vias extend through the encapsulation and the substrate to contact the top side of the bottom-side terminals.

15. The semiconductor package of claim 14, wherein the laser-ablated via holes are formed by a laser.

16. The semiconductor package of claim 14, wherein the vias provide electrical connections from the top-surface terminals to the bottom-side terminals.

17. The semiconductor package of claim 14 wherein the vias are not exposed at the bottom side of the substrate.

* * * * *